United States Patent
Knisley et al.

(10) Patent No.: US 11,532,474 B2
(45) Date of Patent: Dec. 20, 2022

(54) DEPOSITION OF RHENIUM-CONTAINING THIN FILMS

(71) Applicants: Applied Materials, Inc., Santa Clara, CA (US); Wayne State University, Detroit, MI (US)

(72) Inventors: Thomas Knisley, Livonia, MI (US); Keenan N. Woods, San Ramon, CA (US); Mark Saly, Santa Clara, CA (US); Charles H. Winter, Bloomfield Hills, MI (US); Stefan Cwik, Braintree, MA (US)

(73) Assignee: Applied Materials, Inc., Santa Clara, CA (US)

( * ) Notice: Subject to any disclaimer, the term of this patent is extended or adjusted under 35 U.S.C. 154(b) by 284 days.

(21) Appl. No.: 16/989,079

(22) Filed: Aug. 10, 2020

(65) Prior Publication Data
US 2021/0050211 A1    Feb. 18, 2021

Related U.S. Application Data

(60) Provisional application No. 62/885,547, filed on Aug. 12, 2019.

(51) Int. Cl.
*H01L 21/02* (2006.01)
*C23C 16/34* (2006.01)

(52) U.S. Cl.
CPC ........ *H01L 21/02175* (2013.01); *C23C 16/34* (2013.01); *H01L 21/0228* (2013.01); *H01L 21/02205* (2013.01)

(58) Field of Classification Search
CPC ......... H01L 21/02175; H01L 21/02205; H01L 21/0228; C23C 16/06; C23C 16/08; C23C 16/305; C23C 16/34; C23C 16/45534; C23C 16/45553
See application file for complete search history.

(56) References Cited

U.S. PATENT DOCUMENTS

| 2002/0110991 A1* | 8/2002 | Li ................... C23C 16/45523 438/347 |
| 2018/0155832 A1* | 6/2018 | Hamalainen ............. C23C 16/06 |
| 2001/8015583 | 7/2018 | Hamalainen et al. |

OTHER PUBLICATIONS

Detwiler, Michael D., et al., "Characterization and theory of Re films on Pt(111) grown by UHV-CVD", Surface Science (2015) 8 pages.
Duke, Audrey S, et al., "In Situ Studies of Carbon Monoxide Oxidation on Platinum and Platinum-Rhenium Alloy Surfaces", J. Phys. Chem. C 2015, 119, 381-391.
Oktay, Serkan, et al., "XPS investigations of tribolayers formed on TiN and (Ti,Re)N coatings", Applied Surface Science 328 (2015) 255-261.

(Continued)

*Primary Examiner* — Brook Kebede
(74) *Attorney, Agent, or Firm* — Servilla Whitney LLC

(57) ABSTRACT

Methods for depositing rhenium-containing thin films on a substrate are described. The substrate is exposed to a rhenium precursor and a reducing agent to form the rhenium-containing film (e.g., metallic rhenium, rhenium nitride, rhenium oxide, rhenium carbide). The exposures can be sequential or simultaneous. The rhenium-precursors are substantially free of halogen.

19 Claims, 1 Drawing Sheet

(56) References Cited

OTHER PUBLICATIONS

Ramstad, A., et al., "Growth and alloy formation studied by photoelectron spectroscopy and STM", Surface Science 425 (1999) 57-67, Jan. 4, 1999.

Rimoldi, Martino, et al., "Atomic Layer Deposition of Rhenium-Aluminum Oxide Thin Films and ReOx Incorporation in a Metal-Organic Framework", ACS Appl. Mater. Interfaces 2017, 9, 35067-35074, Sep. 20, 2017.

Herrmann, Wolfgang A, et al., "Mehrfachbindungen zwischen Hauptgruppenelementen und Ubergangsmetallen CLXVI. 1 Molekulare Organorhenium-Vorstufen fur CVD-prozesse", Journal of Organometallic Chemistry 553 (1998) 443-452.

* cited by examiner

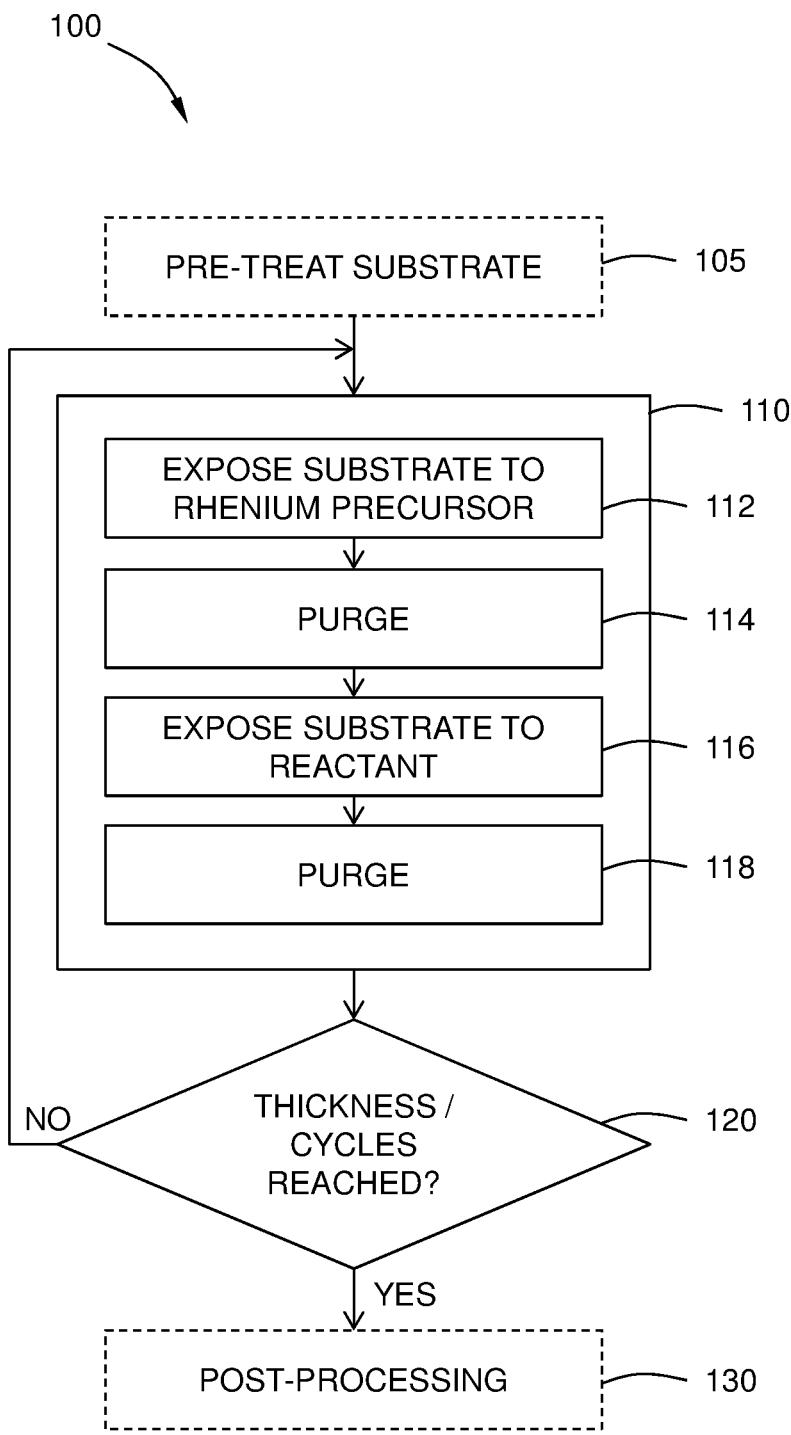

DEPOSITION OF RHENIUM-CONTAINING THIN FILMS

CROSS-REFERENCE TO RELATED APPLICATIONS

This application claims priority to U.S. Provisional Application No. 62/885,547, filed Aug. 12, 2019, the entire disclosure of which is hereby incorporated by reference herein.

TECHNICAL FIELD

Embodiments of the present disclosure generally relate to methods for depositing rhenium-containing thin films. In particular, embodiments of the disclosure are directed to methods of depositing rhenium-containing thin films by atomic layer deposition in the absence of a halide.

BACKGROUND

Deposition of thin films on a substrate surface is an important process in a variety of industries including semiconductor processing, diffusion barrier coatings, and dielectrics for magnetic read/write heads. In the semiconductor industry, in particular, miniaturization requires atomic level control of thin film deposition to produce conformal coatings on high aspect structures.

One method for deposition of thin films is atomic layer deposition (ALD). Most ALD processes are based on binary reaction sequences, where each of the two surface reactions occurs sequentially. Because the surface reactions are sequential, the two gas phase reactants are not in contact, and possible gas phase reactions that may form and deposit particles are limited.

As microelectronic device sizes become smaller, challenges exist with current metal films used for contacts, barrier layers, etc. New metals and metal films are needed for a variety of applications in microelectronic devices. Rhenium has not been previously used in microelectronic applications. Accordingly, there is a need in the art for new methods of depositing rhenium-containing films for microelectronic devices.

SUMMARY

One or more embodiments of the disclosure are directed to methods of depositing a film. A substrate is exposed to a rhenium precursor to deposit a film on the substrate. The processing chamber is purged of the rhenium precursor and the substrate is exposed to a reducing agent to react with the film to form one or more of a rhenium metal film, a rhenium metal nitride film, a rhenium oxide film, or a rhenium carbide film on the substrate. The processing chamber is then purged of the reducing agent.

Additional embodiments of the disclosure are directed to methods of depositing a film. A metal film is selectively formed by a process cycle comprising sequential exposure of a substrate to a rhenium precursor, purge gas, a reducing agent, and purge gas. The process cycle is repeated to selectively form a rhenium film on the substrate, wherein the rhenium film is substantially free of halide.

Further embodiments of the disclosure are directed to methods of depositing a film comprising selectively forming a rhenium-containing film in a process cycle comprising sequential exposure of a substrate to a rhenium precursor, purge gas, reducing agent, and purge gas, wherein the rhenium-containing film is substantially free of halide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 illustrates a flowchart of a processing method in accordance with one or more embodiment of the disclosure.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface. In one or more embodiments, the method is performed in the absence of a halide. As used here, the term "in the absence of a halide" means that there is less than 5%, including less than 4%, less than 3%, less than 2%, less than 1%, and less than 0.5% of a halide present during the atomic layer deposition (ALD) process.

Rhenium (Re) metal can be grown by atomic layer deposition for many applications. One or more embodiments of the disclosure advantageously provide processes for atomic layer deposition to form rhenium-containing films. As used in this specification and the appended claims, the term "rhenium-containing film" refers to a film that comprises rhenium atoms and has greater than or equal to about 1 atomic % rhenium, 2 atomic % rhenium, 3 atomic % rhenium, 4 atomic % rhenium, 5 atomic % rhenium, 10 atomic % rhenium, or 15 atomic % rhenium. In some embodiments, the rhenium-containing film comprises one or more of rhenium metal (zero-valent rhenium), rhenium nitride (ReN), rhenium oxide ($ReO_3$), or rhenium carbide (ReC). The skilled artisan will recognize that the use of molecular formula like ReN does not imply a specific stoichiometric relationship between the elements but merely the identity of the major components of the film. For example, ReN refers to a film whose major composition comprises rhenium and nitrogen atoms. In some embodiments, the major composition of the specified film (i.e., the sum of the atomic percent of the specified atoms) is greater than or equal to about 95%, 98%, 99% or 99.5% of the film, on an atomic basis.

Some embodiments of the disclosure advantageously provide thin films with a variety of applications in microelectronic devices. Some embodiments advantageously provide processes of depositing rhenium-containing films having low-resistivity. In some embodiments, the rhenium-containing film has a resistivity less than or equal to about 300 µohm-cm.

One or more embodiments advantageously provide the halide free atomic layer deposition (ALD) of rhenium (Re) metal thin films. In one or more embodiments, alkyltrioxorhenium-based compounds, including, but not limited to, methyltrioxorhenium(VII) (MTO) and related analogues, are used as precursors to form rhenium (Re) metal thin films. Without intending to be bound by theory, it is thought that halogen-containing rhenium precursors (e.g., $ReCl_5$) can etch metal substrates (e.g., Co, Cu). In one or more embodiments, the absence of halogen-based precursors in this alkyltrioxorhenium-based approach eliminates this undesirable effect. Accordingly, in one or more embodiments, the alkyltrioxorhenium-based precursor is substantially free of halogen. As used herein, the term "substantially free" means that there is less than 5%, including less than 4%, less than 3%, less than 2%, less than 1%, and less than 0.5% of a halogen present in the alkyltrioxorhenium-based precursor.

In one or more embodiments, 1,1-dimethylhydrazine (DMH) is used in conjunction with methyltrioxorhenium(VII) (MTO) as a precursor to form rhenium (Re) metal thin films.

In one or more embodiments, the rhenium-containing film that is formed is substantially free of a halide. As used herein, the term "substantially free" means that there is less than 5%, including less than 4%, less than 3%, less than 2%, less than 1%, and less than 0.5% of a halide present in the rhenium-containing film. As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

With reference to FIG. 1, one or more embodiments of the disclosure are directed to method 100 of depositing a thin film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, an adhesion layer, such as titanium nitride, is deposited at operation 105.

At deposition 110, a process is performed to deposit a rhenium-containing thin film on the substrate (or substrate surface). The deposition process can include one or more operations to form a film on the substrate. In operation 112, the substrate (or substrate surface) is exposed to a rhenium precursor to deposit a film on the substrate (or substrate surface). The rhenium precursor can be any suitable rhenium-containing compound that can react with (i.e., adsorb or chemisorb onto) the substrate surface to leave a rhenium-containing species on the substrate surface. In some embodiments, the rhenium precursor comprises an alkyltrioxorhenium-based precursor, such as one or more of methyltrioxorhenium(VII) (MTO) or R—$ReO_3$, where "R" is an alkyl group having from 1 to 12 carbon atoms. In some embodiments, the rhenium precursor consists essentially of methyltrioxorhenium(VII) (MTO). As used in this manner, the term "consists essentially of" means that the rhenium precursor comprises greater than or equal to about 95%, 98%, 99% or 99.5% of methyltrioxorhenium(VII) (MTO), on a molecular basis. The presence of diluent, carrier and/or inert gases, for example, is not taken into consideration in the calculation.

The substrate (or substrate surface) can be any suitable surface. Suitable surfaces include, but are not limited to, silicon (Si), silicon dioxide ($SiO_2$), silicon oxide ($SiO_x$), silicon oxycarbide (SiOC), platinum (Pt), titanium nitride (TiN), tantalum nitride (TaN), copper (Cu), cobalt (Co), tungsten (W), ruthenium (Ru), molybdenum (Mo) or combinations thereof.

At operation 114, the processing chamber is purged to remove unreacted rhenium precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the rhenium precursor by any suitable technique including, but not limited to, moving the substrate through a gas curtain to a portion or sector of the processing chamber that contains none or substantially none of the rhenium precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is exposed to a reducing agent to form one or more of a metal film or a metal nitride film. The reducing agent can react with the rhenium-containing species on the substrate surface to form the rhenium-containing film. In some embodiments, the reducing agent comprises one or more of 1,1-dimethylhydrazine (DMH), alkyl amine, hydrazine, alkyl hydrazine, allyl hydrazine, hydrogen, ammonia, alcohols, water, oxygen ($O_2$), ozone ($O_3$), peroxides, and plasmas thereof. In one or more specific embodiments, the reducing agent consists essentially of 1,1-dimethylhydrazine (DMH). In some embodiments, the alkyl amine is selected from one or more of tert-butyl amine ($tBuNH_2$), isopropyl amine ($iPrNH_2$), ethylamine ($CH_3CH_2NH_2$), diethylamine (($CH_3CH_2)_2NH$) or butyl amine ($BuNH_2$). In some embodiments, the reducing agent comprises one or more of compounds with the formula $R'NH_2$, $R'_2NH$, $R'_3N$, $R'_2SiNH_2$, $(R'_3Si)_2NH$, $(R'_3Si)_3N$ or main group alkyls such as $GeR'_3$ and analogues; where each R' is independently H or an alkyl group having 1-12 carbon atoms. In some embodiments, the alkyl amine consists essentially of one or more of tert-butyl amine ($tBuNH_2$), isopropyl amine ($iPrNH_2$), ethylamine ($CH_3CH_2NH_2$), diethylamine (($CH_3CH_2)_2NH$), butyl amine ($BuNH_2$).

At operation 118, the processing chamber is purged after exposure to the reducing agent. Purging the processing chamber in operation 140 can be the same process or different process than the purge in operation 120. Purging the processing chamber, portion of the processing chamber, area adjacent the substrate surface, etc., removes unreacted reducing agent, reaction products and by-products from the area adjacent the substrate surface.

At decision 120, the thickness of the deposited film, or number of cycles of rhenium-precursor and reducing agent is considered. If the deposited film has reached a predetermined thickness or a predetermined number of process cycles have been performed, the method 100 moves to a post-processing operation 130. If the thickness of the deposited film or the number of process cycles has not reached the predetermined threshold, the method 100 returns to operation 110 to expose the substrate surface to the rhenium precursor again in operation 112, and continuing.

The post-processing operation 130 can be, for example, a process to modify film properties (e.g., annealing) or a further film deposition process (e.g., additional ALD or CVD processes) to grow additional films. In some embodiments, the post-processing operation 130 can be a process that modifies a property of the deposited film. In some embodiments, the post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the rhenium precursor, reducing agent or thermal budget of the device. In some embodiments, exposures to the rhenium precursor (operation 112) and the reducing agent (operation 116) occur at the same temperature. In some embodiments, the substrate is maintained at a temperature in a range of about 300° C. to about 500° C., or in the range of about 350° C. to about 400° C.

In some embodiments, exposure to the rhenium precursor (operation 112) occurs at a different temperature than the exposure to the reducing agent (operation 116). In some embodiments, the substrate is maintained at a first temperature in a range of about 300° C. to about 500° C. for the exposure to the rhenium precursor, and at a second temperature in the range of about 300° C. to about 500° C. for exposure the reducing agent.

In the embodiment illustrated in FIG. 1, deposition operation 110 the substrate (or substrate surface) is exposed to the rhenium precursor and the reducing agent sequentially. In another, un-illustrated, embodiment, the substrate (or substrate surface) is exposed to the rhenium precursor and the reducing agent simultaneously in a CVD reaction. In a CVD reaction, the substrate (or substrate surface) can be exposed to a gaseous mixture of the rhenium precursor and reducing agent to deposit a rhenium-containing film having a predetermined thickness. In the CVD reaction, the rhenium-containing film can be deposited in one exposure to the mixed reactive gas, or can be multiple exposures to the mixed reactive gas with purges between.

In some embodiments, the rhenium-containing film formed comprises rhenium metal. Stated differently, in some embodiments, the rhenium-containing film comprises a metal film comprising rhenium. In some embodiments, the metal film consists essentially of rhenium. As used in this manner, the term "consists essentially of rhenium" means that the rhenium-containing film is greater than or equal to about 80%, 85%, 90%, 95%, 98%, 99% or 99.5% rhenium, on an atomic basis. Measurements of the composition of the rhenium-containing film refer to the bulk portion of the film, excluding interface regions where diffusion of elements from adjacent films may occur.

In some embodiments, the rhenium-containing thin film comprises or consists essentially of rhenium, the rhenium precursor comprises, or consists essentially of, methyltrioxorhenium(VII) (MTO), the reducing agent comprises, or consists essentially of, 1,1-dimethyl hydrazine, and the substrate is maintained at a temperature greater than or equal to ($\geq$) 200° C.

The deposition temperature can be modified to change the composition of the rhenium-containing film. At lower temperatures, the inventors have found that a lower deposition temperature using the same reducing agent can result in formation of a ReN film instead of a Re metal film. In some embodiments, the rhenium-containing film is a metal nitride film. In some embodiments, the metal nitride film comprises or consists essentially of rhenium nitride. In some embodiments, the rhenium precursor comprises, or consists essentially of, methyltrioxorhenium(VII) (MTO), the reducing agent comprises, or consists essentially of, 1,1-dimethyl hydrazine, and the substrate is maintained at a temperature in a range of about 300° C. to less than about 400° C. In some embodiments, the rhenium-containing film comprises ReN with a nitrogen content greater than or equal to about 5%, 7.5%, 10%, 12.5 or 15%, on an atomic basis. In some embodiments, the rhenium-containing film comprises a nitrogen content in the range of about 2% to about 30%, or in the range of about 3% to about 25%, or in the range of about 4% to about 20%, on an atomic basis.

In other embodiments, the rhenium-containing film comprises rhenium oxide ($ReO_3$) with an oxygen content of greater than or equal to about 5%, 7.5%, 10%, 12.5 or 15%, on an atomic basis. In some embodiments, the rhenium-containing film comprises an oxygen content in the range of about 2% to about 30%, or in the range of about 3% to about 25%, or in the range of about 4% to about 20%, on an atomic basis.

In other embodiments, the rhenium-containing film comprises rhenium carbide (ReC) with a carbon content of greater than or equal to about 5%, 7.5%, 10%, 12.5 or 15%, on an atomic basis. In some embodiments, the rhenium-containing film comprises a carbon content in the range of about 2% to about 30%, or in the range of about 3% to about 25%, or in the range of about 4% to about 20%, on an atomic basis.

The deposition operation 110 can be repeated to form a metal film or a metal nitride film or a metal oxide film or a metal carbide film having a predetermined thickness. In some embodiments, the deposition operation 110 is repeated to provide a metal film or a metal nitride film or a metal oxide film or a metal carbide film having a thickness in the range of about 0.3 nm to about 10 nm, or in the range of about 30 Å to about 3000 Å.

Some embodiments of the disclosure provide rhenium-containing films with high resistivity. In some embodiments, the resistivity of the rhenium-containing film is in the range of about 50 μΩ-cm to about 300 μΩ-cm. In some embodiments, the rhenium-containing film has a resistivity less than or equal to about 300 μΩ-cm, less than or equal to about 250 μΩ-cm, less than or equal to about 200 μΩ-cm, less than or equal to about 150 μΩ-cm, less than or equal to about 100 μΩ-cm, or less than or equal to about 75 μΩ-cm. In some embodiments, the rhenium-containing film has a resistivity greater than or equal to about 80 μΩ-cm, 90 μΩ-cm, 100 μΩ-cm, 110 μΩ-cm, 120 μΩ-cm or 130 μΩ-cm.

One or more embodiments of the disclosure are directed to methods of depositing rhenium-containing metal films in high aspect ratio features. A high aspect ratio feature is a trench, via or pillar having a height: width ratio greater than or equal to about 10, 20 or 50. In some embodiments, the rhenium-containing metal film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gap fill of a feature. A bottom-up gap fill process fills the feature from the bottom versus a conformal process which fills the feature from the bottom and sides. In some embodiments, the feature has a first material at the bottom (e.g., a nitride) and a second material (e.g., an oxide) at the sidewalls. The rhenium-containing method film deposits selectively on the first material relative to the second material so that the metal film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reducing agent). According to one or more embodiments, a purge gas is injected at the exit of the deposition chamber to prevent reactants (e.g., reducing agent) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

EXAMPLES

ALD experiments were performed in an ALD reactor at process temperatures ranging from 300° C. to 400° C. on Si(100), $SiO_2$ (300 nm)/Si, TiN (~24 nm)/$SiO_2$/Si, and TaN/Si without removal of the native oxide. The metal precursor MeReO$_3$ was delivered from a booster into the reactor chamber at 45° C. ALD experiments were conducted in the sequence MTO pulse (4 s)—Purge (20 s)—DMH pulse (0.1 s)—Purge (20 s). For the delivery of the reducing agent DMH, a conventional vapor-draw bubbler was used. In order to limit the consumption a flow restricting VCR gasket (100 μm) was installed in the bubbler line.

Example 1: To address the thermal stability of the metal precursor MTO under process conditions, MTO was pulsed into the reactor chamber without co-reactant (500 cycles: 4 s MTO—40 s purge). Thermal decomposition was observed on the metal surfaces i.e. Co, Cu, Ru, and Pt. In contrast, no film growth was observed on Si, $SiO_2$, TiN, and TaN at temperatures up to 400° C. by XRF. Additionally, the sheet resistance remained unchanged.

Example 2: After the evaluation of the thermal stability of MTO, the saturation of the precursor was investigated to ensure a self-limiting ALD process. The deposition temperature was set to 340° C. and the 1,1-dimethyl hydrazine (DMH) pulse time was set to 0.1 s. The film thickness, as evaluated by SEM, revealed a constant growth rate per cycle (GPC) from 3 s to 5 s MTO pulse time. The resistivity of the formed thin film reduces at pulse times ≥4 s. The additional quantification of the Re amount on the surface with XRF revealed an increase up to a pulse time of 4 s. As consequence, a saturative pulse time of 4 s was selected.

Example 3: At optimized pulse times for MTO and DMH, a temperature series was carried out in the range from 300° C. to 400° C. to evaluate a potential ALD window and to gain insight into the film resistivities with respect to deposition temperature. At low temperatures, the GPC is minimum, raising steadily with the temperature until the ALD window at 340-350° C. Raising the deposition temperature to 340° C. decreases the resistivity from up to 400 μΩcm to values below 250 μΩcm with a GPC of 0.6 Å/cycle. At temperatures above the ALD window, the GPC increases due to thermal decomposition of the precursor MTO up to 1.5 Å/cycle, and the resistivity decreases to 160 μΩcm, which can be explained by decreased N content due to enhanced decomposition of ReN$_x$ at elevated temperatures. The GPC changes with respect to the temperatures are confirmed by XRF results for the $SiO_2$ samples.

Example 4: The linearity of the process was investigated by thickness determination with respect to the numbers of cycles revealing a GPC of 0.85 Å/cycle on $SiO_2$ and 0.78 Å/cycle on TiN. A pronounced nucleation delay of 109 cycles was present for the growth on $SiO_2$ while the nucleation is twice as fast on TiN, as summarized in Table 1. The resistivity of Re on $SiO_2$ decreases strongly at thicknesses higher than 10 nm down to 230 μΩcm. Re films on TiN have a resistivity around 100 μΩcm for low thicknesses which is reasoned by the conductivity of the substrate. Additionally, the nucleation delay is in-line with the SEM data. Furthermore, the growth behavior and nucleation delay was investigated on Si (with native oxide) TaN, and H-terminated Si by XRF revealing comparable growth rates to the earlier discussed substrates. Thus, the nucleation delay varies by the substrate surface choice. Nucleation was found to be slowest on Si and TaN with a delay of 140 cycles. HF treatment of the Si substrate reduces the delay down to 73 cycles (Table 1).

TABLE 1

Growth rate and nucleation delay of Re films as evaluated by SEM and XRF

| Substrate | Growth Rate | Nucleation Delay |
|---|---|---|
| $SiO_2$ | 0.85 Å/cycle | SEM: 109 cycles |
| | | XRF: 113 cycles |
| TiN | 0.78 Å/cycle | SEM: 58 cycles |
| | | XRF: 64 cycles |
| Si | 0.71 Å/cycle* | XRF: 141 cycles |
| TaN | 0.78 Å/cycle* | XRF: 140 cycles |
| Si—H | 0.65 Å/cycle* | XRF: 73 cycles |

Example 5: The composition of the Re thin films was investigated by XPS with sequential Ar$^+$ sputtering. The corresponding depth profiles reveal typical occurring surface contaminations which are removed by Ar$^+$ erosion. After 600 s etching, the bulk of the films is reached whose composition is summarized in Table 2. A Re content of 84 at. % could be reached and both C and O are only present in negligible quantities. The main non-metal contribution to the film composition was N, with 12 at. %, indicating formation of nitride species during film growth. The minimum O content suggests a complete reaction of the oxygen containing MTO to Re metal and ReN$_x$. The low C content of 2.6 at. % can be explained by incomplete desorption and embedding of DMH fragments and the methyl group of MTO.

TABLE 2

Re thin film bulk composition as evaluated by XPS

| | Re 4f$_{7/2}$ | N 1 s | O 1 s | C 1 s |
|---|---|---|---|---|
| Concentration [at. %] | 83.84 | 11.97 | 1.64 | 2.55 |

Example 6: The high resolution XPS spectra of the elements in the film bulk was measured. The Re 4f$_{7/2}$ binding energy of 40.7 eV corresponds to Re metal, which has been reported in the range from 40.3 to 40.8 eV[3-6]. The additional presence of Re nitride bonds is indicated at higher binding energies since ReN$_x$ appear at around 42.2 eV[7]. The binding energies of N 1s of 397.8 eV correspond to metal nitrides rather than organic N species[6]. While the O 1s peak shows a typical oxide binding energy of 530.6 eV, the C 1s species at 283.8 eV is attributed to aliphatic carbon from the reducing agents embedded into the film during Re growth.

Example 7: For the study of the surface morphology, the thin films were investigated by means of AFM and the RMS roughness was evaluated. Thin films grown on Si had a surface roughness of 2.7 nm for a 70 nm thick film, which reflects the crystallite grain height and grain boundaries. A lower film thickness is expected to reduce the roughness further since it typically scales with the thickness.

Example 8: A Re film grown at 400° C. was found to be crystalline by GI-XRD. A main reflection at 40° corresponds to Re metal in orientation. An additional reflection at 45° suggests the coexistence of $ReN_x$. As a consequence, an additional post-deposition treatment is required to obtain pure Re metal since an increase of the process temperature to 400° C. is not sufficient to grow pure metal.

Example 9: The nucleation behavior was studied with respect to the substrate. The ALD experiments were carried out on untreated $SiO_2$ structures and on in-situ TiN covered structure to yield a 8 nm film and studied by TEM. An improved nucleation behavior was observed on in-situ TiN yielding a more homogenous coverage of the structures (98%) than for the $SiO_2$ trench structure where the thickness is non-homogenous. This is attributed to the poor nucleation on $SiO_2$, which leads to island growth.

Example 10: Post-treatment of an as-deposited rhenium-containing film at 600° C. under inert gas (Ar) was shown to decreases C, N, and O impurities and produces a pure rhenium film. The film resistivity was improved by the post-treatment, down to 74 μΩcm. Table 3 shows the results of this study.

TABLE 3

Bulk composition of a Re thin film after post-treatment at 600° C. under Ar atmosphere as evaluated by XPS

| | Re $4f_{7/2}$ | N 1s | O 1s | C 1s |
|---|---|---|---|---|
| Concentration [at. %] | 98.36 | 0 | 0 | 1.64 |

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
    exposing a substrate to a rhenium precursor in a processing chamber to deposit a film on the substrate, wherein the rhenium precursor is substantially free of halogen;
    purging the processing chamber of the rhenium precursor;
    exposing the substrate to a reducing agent to react with the film to form one or more of a rhenium metal film, a rhenium metal nitride film, a rhenium oxide film, or a rhenium carbide film on the substrate; and
    purging the processing chamber of the reducing agent.

2. The method of claim 1, wherein the rhenium precursor comprises one or more of methyltrioxorhenium (MTO) or R—$ReO_3$, wherein R is an alkyl group having from 1-12 carbon atoms.

3. The method of claim 1, wherein the rhenium metal film, the rhenium metal nitride film, the rhenium oxide film, or the rhenium carbide film is substantially free of a halide.

4. The method of claim 3, wherein the reducing agent comprises 1,1-dimethylhyrdazine.

5. The method of claim 1, wherein the reducing agent comprises one or more of hydrazine, 1,1-dimethylhydrazine (DMH), alkyl hydrazine, allyl hydrazine, hydrogen, ammonia, alkylamines, alcohol, water, oxygen ($O_2$), ozone ($O_3$), peroxides, and plasmas thereof.

6. The method of claim 1, wherein the substrate comprises one or more of silicon (Si), silicon dioxide ($SiO_2$), silicon oxide (SiO), silicon oxycarbide (SiOC), platinum (Pt), titanium nitride (TiN), tantalum nitride (TaN), copper (Cu), cobalt (Co), tungsten (W), ruthenium (Ru) or molybdenum (Mo).

7. The method of claim 1, wherein the substrate is maintained at a temperature in a range of about 300° C. to about 500° C.

8. The method of claim 1, further comprising repeating the method to provide a metal film or a metal nitride film having a thickness of about 0.3 to about 10 nm.

9. The method of claim 1, wherein the substrate is exposed to the rhenium precursor and the reducing agent simultaneously.

10. The method of claim 1, wherein the substrate is exposed to the rhenium precursor and the reducing agent sequentially.

11. The method of claim 1, wherein the rhenium metal nitride film has a resistivity of about 50 μΩcm to about 300 μΩcm.

12. The method of claim 1, wherein the rhenium precursor comprises methyltrioxorhenium (MTO), the reducing agent comprises 1,1-dimethyl hydrazine, and the substrate is maintained at a temperature ≥200° C.

13. The method of claim 1, wherein the rhenium precursor comprises R-$ReO_3$, where R is an alkyl group having 1-12 carbon atoms, the reducing agent comprises one or more of hydrogen, ammonia, alkylamines, hydrazine, alkylhydrazines, alcohols, water, and plasmas thereof, and the substrate is maintained at a temperature ≥200° C.

14. The method of claim 1, wherein the metal nitride film comprises rhenium nitride.

15. A method of depositing a film, the method comprising:
    selectively forming a metal film in a process cycle comprising sequential exposure of a substrate to a rhenium precursor that is substantially free of a halogen, purge gas, a reducing agent, and purge gas; and
    repeating the process cycle to selectively form a rhenium film on the substrate, wherein the rhenium film is substantially free of halide.

16. The method of claim 15, wherein the rhenium precursor comprises one or more of methyltrioxorhenium (MTO) or R—$ReO_3$, wherein R is an alkyl group having from 1-12 carbon atoms, the reducing agent comprises one or more of hydrazine, 1,1-dimethylhydrazine (DMH), alkyl hydrazine, allyl hydrazine, hydrogen, ammonia, alkylamines, alcohol, water, and plasmas thereof, and the process cycle is repeated more than 200 times at a temperature ≥200° C.

17. A method of depositing a film, the method comprising:
selectively forming a rhenium-containing film in a process cycle comprising sequential exposure of a substrate to a rhenium precursor, purge gas, reducing agent, and purge gas, wherein the rhenium precursor is substantially free of halogen.

18. The method of claim 17, wherein the rhenium precursor comprises $R\text{-}ReO_3$, where R is an alkyl group having 1-12 carbon atoms.

19. The method of claim 17, wherein the reducing agent comprises one or more of hydrogen, ammonia, alkylamines, hydrazine, alkylhydrazines, alcohols, water, and plasmas thereof.

* * * * *